United States Patent
Curatola

(10) Patent No.: US 9,653,591 B2
(45) Date of Patent: *May 16, 2017

(54) COMPOUND SEMICONDUCTOR DEVICE HAVING AT LEAST ONE BURIED SEMICONDUCTOR MATERIAL REGION

(71) Applicant: Infineon Technologies Austria AG, Villach (AT)

(72) Inventor: Gilberto Curatola, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

This patent is subject to a terminal disclaimer.

(21) Appl. No.: 14/812,884

(22) Filed: Jul. 29, 2015

(65) Prior Publication Data

US 2015/0333166 A1 Nov. 19, 2015

Related U.S. Application Data

(63) Continuation of application No. 14/151,193, filed on Jan. 9, 2014, now Pat. No. 9,123,791.

(51) Int. Cl.
*H01L 29/778* (2006.01)
*H01L 29/205* (2006.01)
(Continued)

(52) U.S. Cl.
CPC ........ *H01L 29/7787* (2013.01); *H01L 21/266* (2013.01); *H01L 21/26546* (2013.01);
(Continued)

(58) Field of Classification Search
CPC ............. H01L 29/2003; H01L 29/7787; H01L 29/66462; H01L 29/7783; H01L 21/775
(Continued)

(56) References Cited

U.S. PATENT DOCUMENTS 7,382,001 B2  6/2008  Beach
7,550,783 B2  6/2009  Wu et al.
(Continued)

FOREIGN PATENT DOCUMENTS

JP  2010232503 A  10/2010

OTHER PUBLICATIONS

Soenmez, et al., "Gallium Nitride for 600V Operation", Power Semiconductors, pp. 25-28, Issue 4, 2011, Power Electronics Europe, pp. 25-28.

*Primary Examiner* — Quoc Hoang
(74) *Attorney, Agent, or Firm* — Murphy, Bilak & Homiller, PLLC

(57) ABSTRACT

A semiconductor device includes a first compound semiconductor material, a second compound semiconductor material on the first compound semiconductor material, the second compound semiconductor material having a first doping concentration and including a different material than the first compound semiconductor material, a control electrode, and at least one buried semiconductor material region having a second doping concentration different from the first doping concentration. The at least one buried semiconductor material region is disposed in the second compound semiconductor material in a region other than a region of the second compound semiconductor material being covered by the control electrode.

16 Claims, 13 Drawing Sheets

(51) Int. Cl.

| | | |
|---|---|---|
| *H01L 29/207* | (2006.01) | |
| *H01L 29/10* | (2006.01) | |
| *H01L 21/265* | (2006.01) | |
| *H01L 21/266* | (2006.01) | |
| *H01L 29/66* | (2006.01) | |
| *H01L 29/06* | (2006.01) | |
| *H01L 29/20* | (2006.01) | |

(52) U.S. Cl.
CPC ...... *H01L 29/0623* (2013.01); *H01L 29/1054* (2013.01); *H01L 29/205* (2013.01); *H01L 29/207* (2013.01); *H01L 29/66462* (2013.01); *H01L 29/7786* (2013.01); *H01L 29/2003* (2013.01)

(58) Field of Classification Search
USPC .................................. 257/194; 438/162, 172
See application file for complete search history.

(56) References Cited

U.S. PATENT DOCUMENTS

| | | | |
|---|---|---|---|
| 7,696,584 | B2 | 4/2010 | Henning et al. |
| 7,893,461 | B2 | 2/2011 | Twynam |
| 7,893,500 | B2 | 2/2011 | Wu et al. |
| 8,030,660 | B2 * | 10/2011 | Saito .................. H01L 29/7787 257/192 |
| 8,283,699 | B2 | 10/2012 | Wu |
| 8,912,570 | B2 * | 12/2014 | Chiang ............. H01L 29/66462 257/192 |
| 9,123,791 | B2 * | 9/2015 | Curatola ............. H01L 29/7786 |
| 2010/0264462 | A1 | 10/2010 | Hirler et al. |
| 2011/0212582 | A1 | 9/2011 | Hong et al. |
| 2013/0140578 | A1 | 6/2013 | Yu et al. |
| 2013/0153967 | A1 | 6/2013 | Curatola et al. |

\* cited by examiner

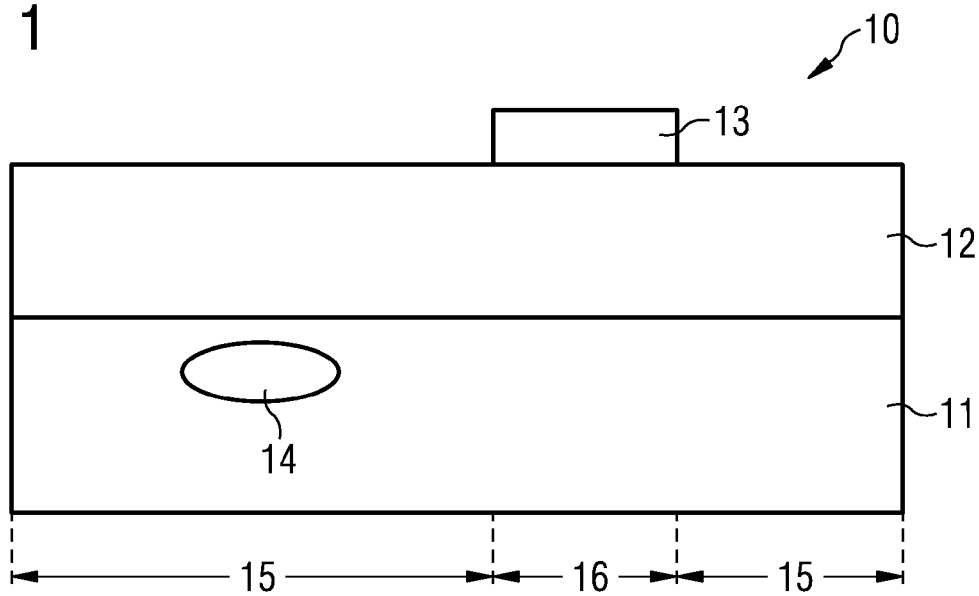
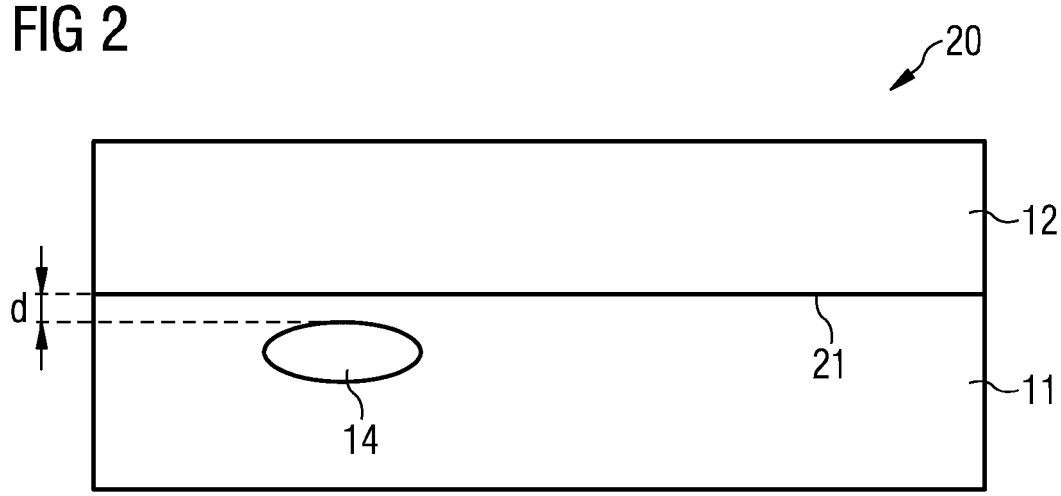

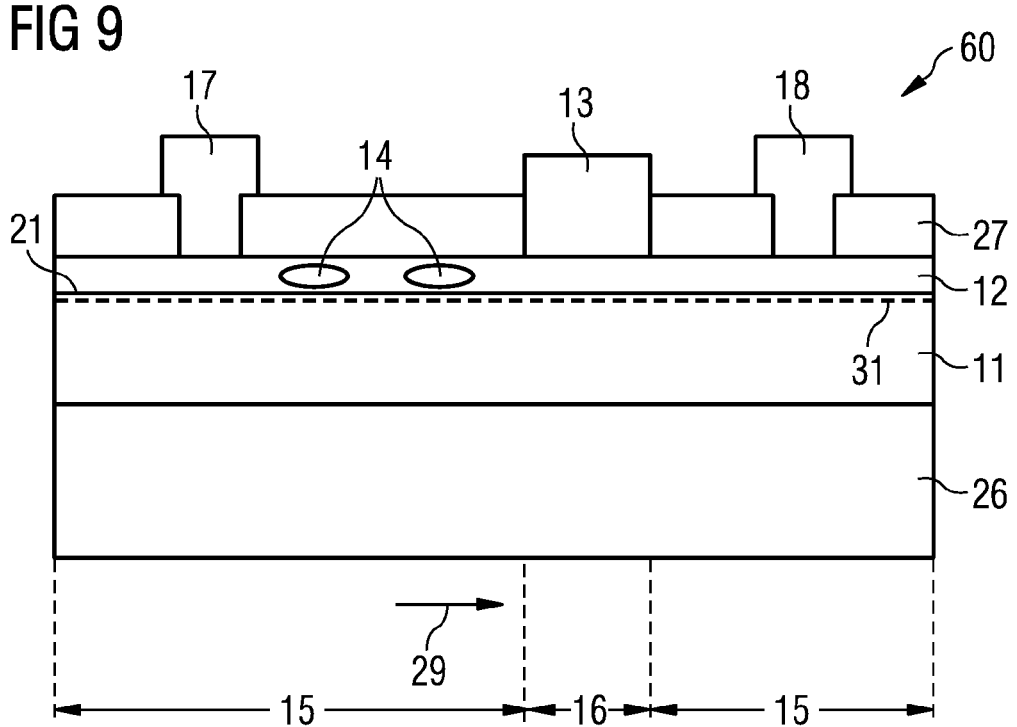
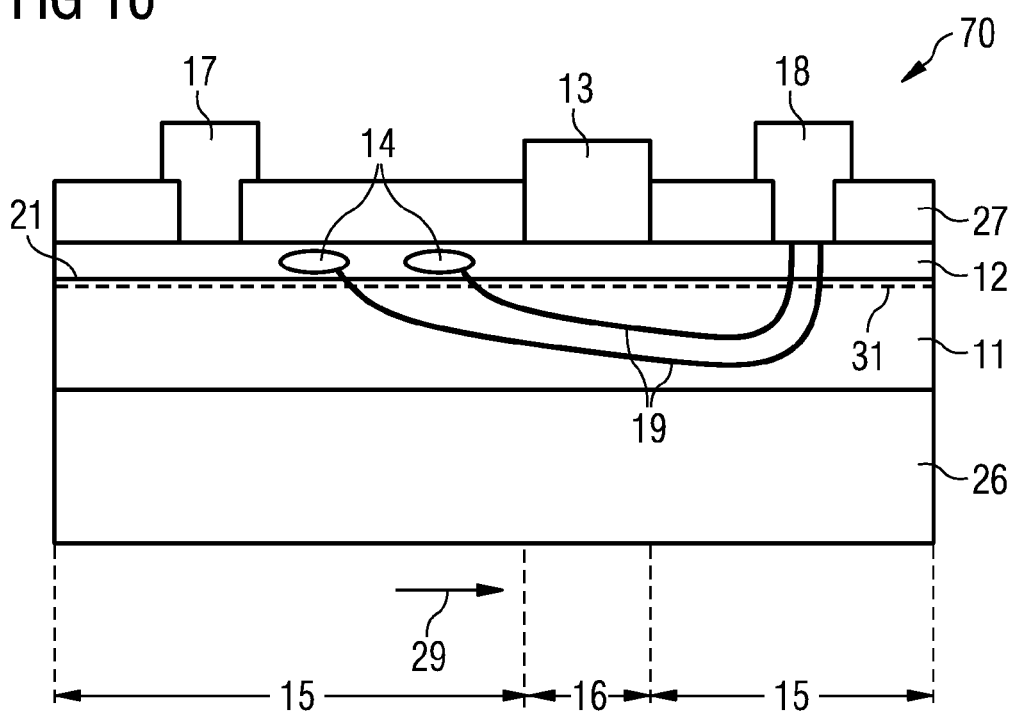

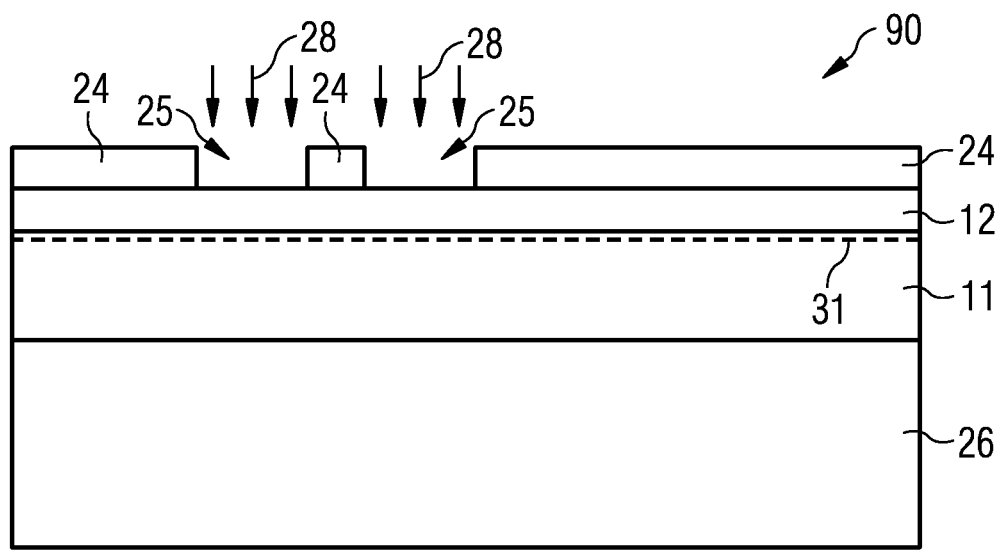
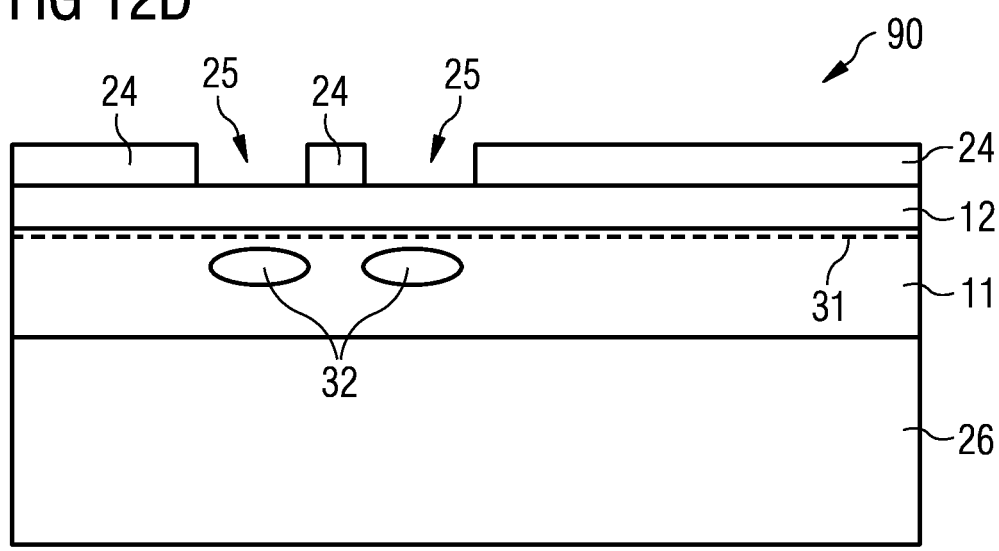

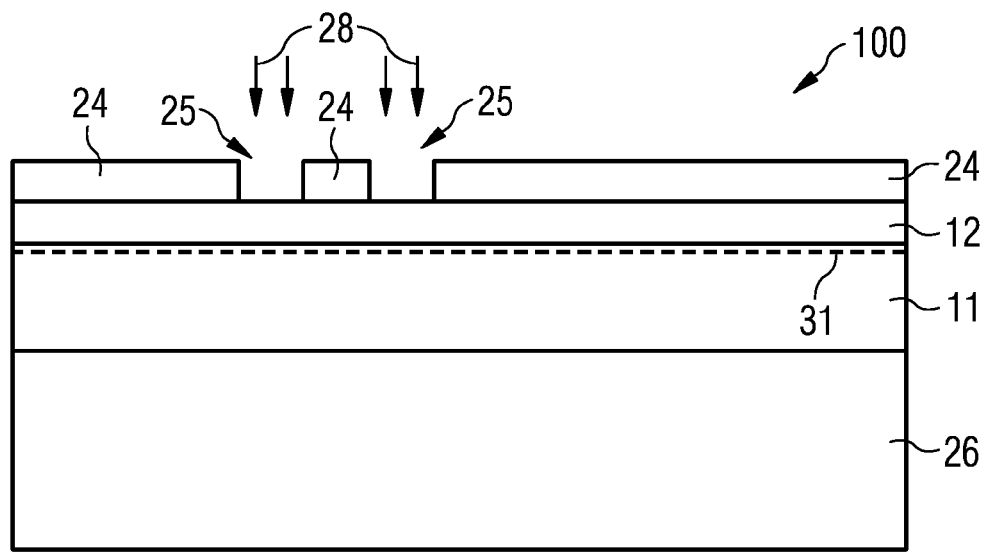
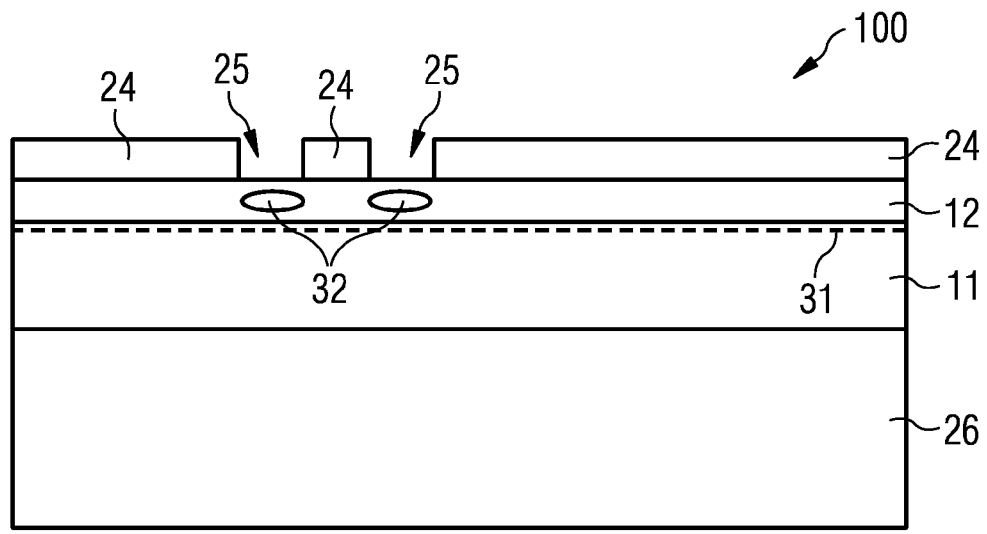

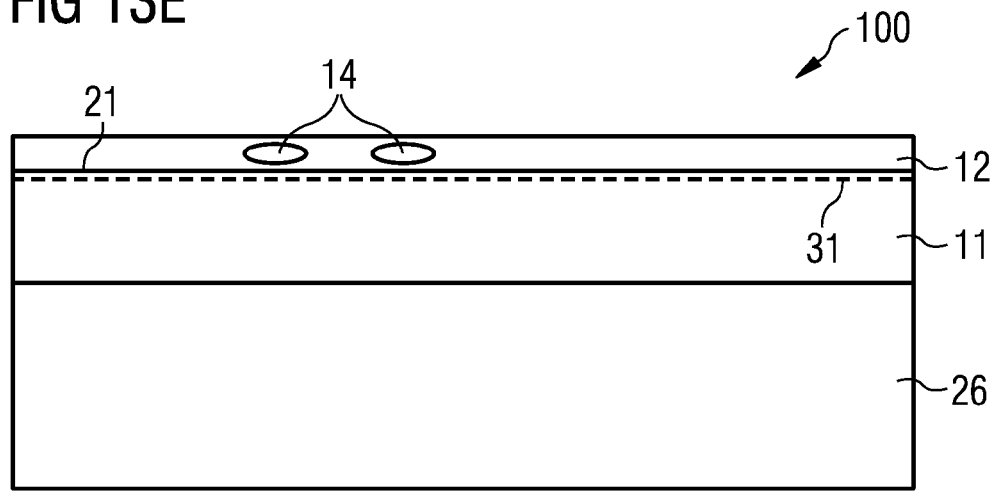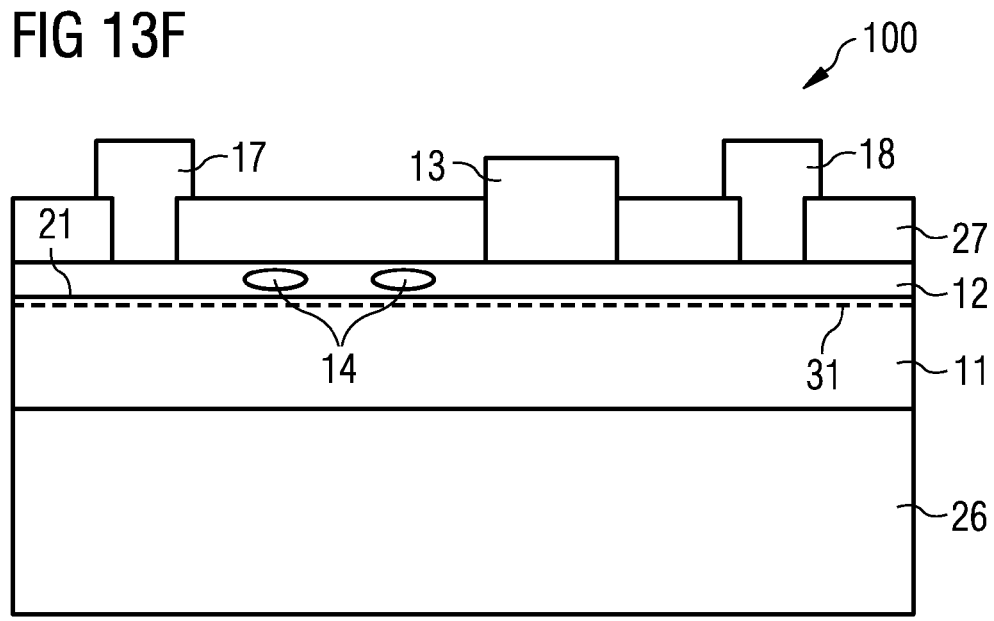

COMPOUND SEMICONDUCTOR DEVICE HAVING AT LEAST ONE BURIED SEMICONDUCTOR MATERIAL REGION

BACKGROUND

Semiconductor devices may be based on different semiconductor materials, for example, silicon, gallium-arsenide and group III-nitrides. A group III-nitride-based semiconductor device, in which gallium nitride is used as part of the semiconductor materials, has a larger bandgap and a higher critical field compared to the semiconductor device which uses silicon as the main material.

By way of example, a group III-nitride-based semiconductor device may include an aluminium gallium nitride/ gallium nitride heterostructure field effect transistor or a high electron mobility transistor (HEMT). Such devices may be formed by depositing layers of appropriate composition and thickness epitaxially on a substrate such as a sapphire substrate, a silicon substrate or a silicon carbide substrate.

A group III-nitride-based semiconductor device may provide a semiconductor device having a low on-resistance and low loss. Such semiconductor devices may be useful for power control, for example. Reducing the device output capacitance may be desirable.

SUMMARY

According to an embodiment of a semiconductor device, the semiconductor device includes a first compound semiconductor material including a first doping concentration and a second compound semiconductor material on the first compound semiconductor material, the second compound semiconductor material including a different material than the first compound semiconductor material. The semiconductor device further includes a control electrode and at least one buried semiconductor material region including a second doping concentration different from the first doping concentration. The at least one buried semiconductor material region is disposed in the first compound semiconductor material in a region other than a region of the first compound semiconductor material being covered by the control electrode.

According to another embodiment of a semiconductor device, the semiconductor device includes a first compound semiconductor material including a first doping concentration and a second compound semiconductor material on the first compound semiconductor material, the second compound semiconductor material including a different material than the first compound semiconductor material and providing a heterojunction with the first compound semiconductor material. The semiconductor device further includes at least one buried semiconductor material region including a second doping concentration different from the first doping concentration. The at least one buried semiconductor material region is disposed in the first compound semiconductor material at a distance d from the heterojunction in a range of $0.25 \ \mu m \leq d \leq 0.7 \ \mu m$.

According to an embodiment of a method of producing a semiconductor device, the method includes: providing a first compound semiconductor material including a first doping concentration; providing a second compound semiconductor material on the first compound semiconductor material, the second compound semiconductor material including a different material than the first compound semiconductor material; providing a control electrode on the second compound semiconductor material; and providing at least one buried semiconductor material region including a second doping concentration different from the first doping concentration, wherein the at least one buried semiconductor material region is disposed in the first compound semiconductor material in a region other than a region of the first compound semiconductor material being covered by the control electrode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. In the drawings, the thicknesses of layers and regions may be exaggerated for clarity. Like reference numerals designate corresponding similar parts. The features of the various illustrated embodiments can be combined unless they exclude each other. Embodiments are depicted in the drawings and are detailed in the description which follows. In the drawings:

FIG. 1 illustrates a schematic view of a semiconductor device according to a first embodiment;

FIG. 2 illustrates a schematic view of a semiconductor device according to a second embodiment;

FIG. 9 illustrates a schematic view of a semiconductor device according to a sixth embodiment;

FIG. 10 illustrates a schematic view of a semiconductor device according to a seventh embodiment;

FIGS. 12A to 12F illustrate a method of producing a semiconductor device according to a second embodiment and FIGS. 13A to 13F illustrate a method of producing a semiconductor device according to a third embodiment.

DETAILED DESCRIPTION

Figure 3:
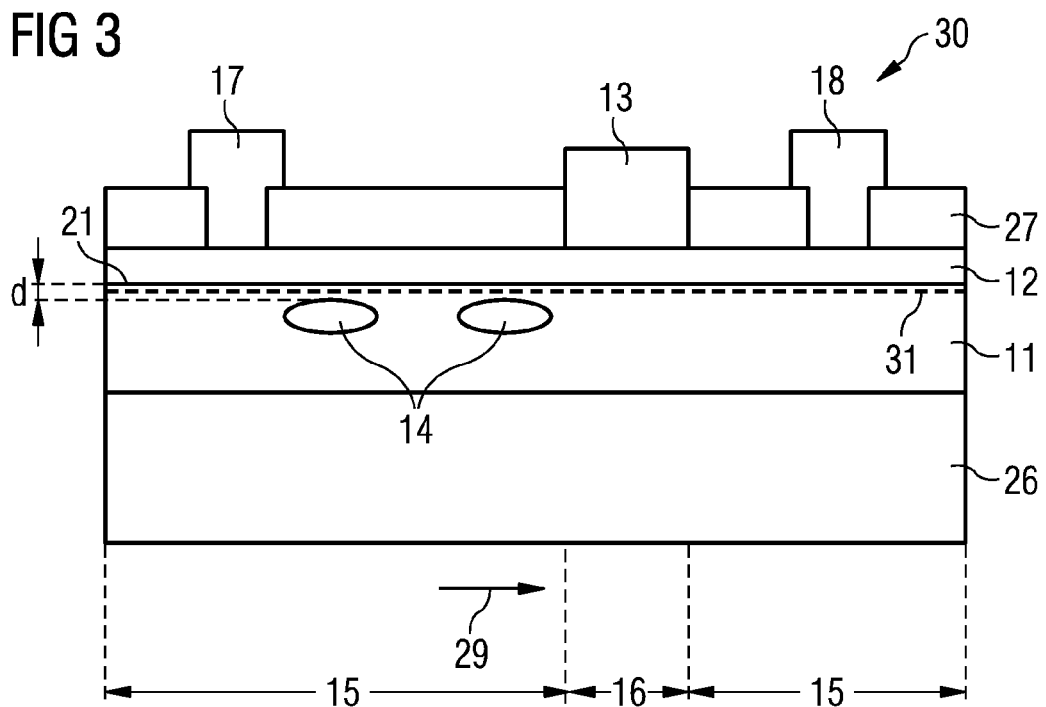
FIG. 3 illustrates a schematic view of a semiconductor device according to a third embodiment.

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

It will be understood that, if an element is referred to as being arranged "on" another element or provided "on" another element, it can be arranged directly on the other element or intervening elements may be present. In contrast, if an element is referred to as being arranged "directly on" another element or provided "directly on" another element, there are no intervening elements present.

As employed in this specification, the terms "coupled" and/or "electrically coupled" are not meant to mean that the elements must be directly coupled together, but intervening elements may be provided between the "coupled" or "electrically coupled" elements. However, if an element is referred to as being "directly coupled" and/or "directly electrically coupled" to another element, there are no intervening elements present.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", if used herein, specify the presence of stated features, integers, steps, operations, elements, layers and/or components, but do not preclude the presence or addition of one or more other features, integers, steps, operations, elements, layers, components and/or groups thereof.

Example embodiments are described herein with reference to cross-sectional illustrations that are schematic illustrations of embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and vice versa and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

As used herein, a compound semiconductor device may include any suitable semiconductor material that forms a field-effect transistor (FET) such as an insulated-gate FET (IGFET), or a high electron mobility transistor (HEMT), for example. The term HEMT is also commonly referred to as HFET (heterostructure field effect transistor), MODFET (modulation-doped FET) or MESFET (metal semiconductor field effect transistor). The terms compound semiconductor device, HFET, HEMT, MESFET and MODFET are used interchangeably herein to refer to a device incorporating a junction between two materials with different band gaps (i.e. a heterojunction) as the channel. Suitable semiconductor materials include compound semiconductor materials such as SiGe, SiC, and group III-V materials including group III-Arsenide, group III-Phosphide, group III-Nitride or any of their alloys. Therefore, the phrase "group III-V" refers to a compound semiconductor that includes a group V element and at least one group III element. Moreover, the phrase "group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Group III-Nitride also refers generally to any polarity including but not limited to Ga-polar, N-polar, semi-polar or non-polar crystal orientations.

These semiconductor materials are semiconductor compounds that have a relatively wide, direct bandgap, and have high critical breakdown fields, high saturation drift velocity and good thermal conductivity. As a result, III-Nitride materials such as GaN are used in many microelectronic applications in which high power density and high efficiency switching are required.

Example embodiments relate to semiconductor devices, and more particularly, to high electron mobility transistors (HEMTs) and methods of manufacturing the same.

FIG. 1 illustrates a schematic view of a section of a semiconductor device 10 according to a first embodiment.

The semiconductor device 10 includes a first compound semiconductor material 11 including a first doping concentration and a second compound semiconductor material 12 on the first compound semiconductor material 11. The second compound semiconductor material 12 includes a different material than the first compound semiconductor material 11. The semiconductor device 10 further includes a control electrode 13 and at least one buried semiconductor material region 14 including a second doping concentration different from the first doping concentration. The at least one buried semiconductor material region 14 is disposed in the first compound semiconductor material 11 in a region 15 other than a region 16 of the first compound semiconductor material 11 being covered by the control electrode 13.

The first compound semiconductor material 11 may include a first bandgap and the second compound semiconductor material 12 may include a second bandgap, the second bandgap being different from the first bandgap. The first compound semiconductor material 11 may include GaN and the second compound semiconductor material may include AlGaN. The semiconductor device 10 may be a high electron mobility transistor (HEMT).

The at least one buried semiconductor material region 14 may include a p-type dopant material. The p-type dopant material may include a doping concentration N, wherein $N > 5 \cdot 10^{17}$ cm$^{-3}$ and may include at least one of B, Al, Ga, Mg, Fe, Cr, Cd and Zn.

The semiconductor device 10 may further include a first current electrode and a second current electrode, wherein in a lateral direction, the at least one buried semiconductor material region 14 is arranged between the first current electrode and the control electrode. The at least one buried semiconductor material region 14 may extend from the first current electrode to the control electrode 13 in the lateral direction.

The semiconductor device 10 may further include at least one field plate including an electrically conductive material, for example a metal or highly doped polysilicon. The at least one field plate may extend in the lateral direction from the second current electrode to the control electrode and may be electrically coupled to the second current electrode.

The at least one buried semiconductor material region 14 may be floating or may be electrically coupled to a fixed electrical potential. Moreover, the at least one buried semiconductor material region 14 may be electrically coupled to the second current electrode. The semiconductor device 10 may further include at least one coupling component electrically coupling the at least one buried semiconductor material region 14 to the second current electrode.

FIG. 2 illustrates a schematic view of a section of a semiconductor device 20 according to a second embodiment.

The semiconductor device 20 includes a first compound semiconductor material 11 including a first doping concentration and a second compound semiconductor material 12 on the first compound semiconductor material 11. The second compound semiconductor material 12 includes a different material than the first compound semiconductor material 11 and provides a heterojunction 21 with the first compound semiconductor material 11. The semiconductor device 20 further includes at least one buried semiconductor material region 14 including a second doping concentration different from the first doping concentration. The at least one buried semiconductor material region 14 is disposed in the first compound semiconductor material 11 at a distance d from the heterojunction 21 in a range of $0.25~\mu m \leq d \leq 0.7~\mu m$.

The first compound semiconductor material 11 may include a first bandgap and the second compound semiconductor material 12 may include a second bandgap, the second bandgap being different from the first bandgap. The first compound semiconductor material 11 may include GaN and the second compound semiconductor material 12 may include AlGaN. The semiconductor device 20 may be a high electron mobility transistor (HEMT).

The at least one buried semiconductor material region 14 may include a p-type dopant material. The p-type dopant material may include a doping concentration N, wherein $N > 5 \cdot 10^{17}$ cm$^{-3}$ and may include at least one of B, Al, Ga, Mg, Fe, Cr, Cd and Zn.

The semiconductor device 20 may further include a first current electrode, a second current electrode and a control electrode, wherein in a lateral direction, the at least one buried semiconductor material region 14 is arranged between the first current electrode and the control electrode. The at least one buried semiconductor material region 14 may extend from the first current electrode to the control electrode 13 in the lateral direction.

The semiconductor device 20 may further include at least one field plate including an electrically conductive material, for example a metal or highly doped polysilicon. The at least one field plate may extend in the lateral direction from the second current electrode to the control electrode and may be electrically coupled to the second current electrode.

The at least one buried semiconductor material region 14 may be floating or may be electrically coupled to a fixed electrical potential. Moreover, the at least one buried semiconductor material region 14 may be electrically coupled to the second current electrode. The semiconductor device 20 may further include at least one coupling component electrically coupling the at least one buried semiconductor material region 14 to the second current electrode.

FIG. 3 illustrates a schematic view of a semiconductor device 30 according to a third embodiment.

The semiconductor device 30 includes a first compound semiconductor material 11 and a second compound semiconductor material 12 on the first compound semiconductor material 11. The second compound semiconductor material 12 includes a different material than the first compound semiconductor material 11. The semiconductor device 30 further includes a substrate 26. The substrate 26 may include Si, SiC or Al$_2$O$_3$. The first compound semiconductor material 11 is arranged on the substrate 26.

In the illustrated embodiment, the first compound semiconductor material 11 includes GaN and the second compound semiconductor material 12 includes AlGaN, i.e. an alloy described by the formula Al$_x$Ga$_{(1-x)}$N, where x<1. The first compound semiconductor material 11 thus includes a first bandgap and the second compound semiconductor material 12 includes a second bandgap, the second bandgap being different from the first bandgap so that a heterojunction 21 is formed at the interface between the respective compound semiconductor materials. A two-dimensional electron gas is formed at the heterojunction 21 formed between the first compound semiconductor material 11 and the second compound semiconductor material 12 and is indicated by a dotted line 31 in FIG. 3. The semiconductor device 30 is thus provided in the form of a gallium nitride-based HEMT (high electron mobility transistor), the first compound semiconductor material 11 providing a channel layer and the second compound semiconductor material 12 providing a barrier layer of the HEMT.

In the illustrated embodiment, both the first compound semiconductor material 11 and the second compound semiconductor material 12 are unintentionally doped. As used herein, the term "unintentionally doped" includes materials (including intrinsic materials) that include dopant atoms, but that are not intentionally or proactively doped. As well understood in the art, a small amount of unintentional doping typically occurs based upon background contamination in whatever apparatus is used to grow or otherwise form the undoped layer. Such materials are also referred to as "intrinsic". With respect to gallium nitride (GaN) and related group III-Nitrides, layers having carrier concentrations of about $1 \cdot 10^{17}$ cm$^{-3}$ or less are typically considered unintentionally doped. As recognized by those familiar with this art, the terms "unintentionally doped" and "undoped" are often used in interchangeable fashion, and they will be understood in that manner in the this specification. The first compound semiconductor material 11 thus includes a first doping concentration of unintentional doping and the second compound semiconductor material 12 includes a third doping concentration of unintentional doping.

The semiconductor device 30 further includes a control electrode 13 arranged on the second compound semiconductor material 12 and providing a gate electrode of the gallium nitride-based HEMT. The control electrode 13 is configured to control the semiconductor device 30 by applying a suitable voltage to the control electrode 13. Moreover, the semiconductor device 30 includes a first current electrode 17 and a second current electrode 18. The first current electrode 17 provides a drain electrode of the gallium nitride-based HEMT and the second current electrode 18 provides a source electrode of the gallium nitride-based HEMT. The first current electrode 17, the second current electrode 18 and the control electrode 13 include an electrically conductive material, for example a metal or highly doped polysilicon.

The semiconductor device 30 further includes a passivation layer 27 arranged on the second compound semiconductor material 12. The passivation layer 27 may include a material selected from the group consisting of $Si_xN_y$, $SiO_2$ and $Al_2O_3$. The control electrode 13, the first current electrode 17 and the second current electrode 18 extend through the passivation layer 27 and directly contact the second compound semiconductor material 12. A region 16 of the first compound semiconductor material 11 is covered by the control electrode 13 with the second compound semiconductor material 12 being arranged between the first compound semiconductor material 11 and the control electrode 13. A further region 15 of the first compound semiconductor material 11 other than the region 16 is not covered by the control electrode 13.

The semiconductor device 30 further includes a plurality of buried semiconductor material regions 14 including a second doping concentration different from the first doping concentration of the first compound semiconductor material 11. The plurality of buried semiconductor material regions 14 includes a p-type dopant material. The p-type dopant material includes a doping concentration N, wherein $N > 5 \cdot 10^{17}$ cm$^{-3}$, and may include at least one of Mg, C, Zn and Cd.

In FIG. 3, two buried semiconductor material regions 14 are illustrated. However, the semiconductor device 30 may include more than two buried semiconductor material regions 14 or may include a single buried semiconductor material region 14. The plurality of buried semiconductor material regions 14 is disposed in the first compound semiconductor material 11 in the region 15 not covered by the control electrode 13 at a distance d from the heterojunction 21 in a range of 0.25 µm ≤ d ≤ 0.7 µm. In a lateral direction which is schematically illustrated in FIG. 3 by an arrow 29, the plurality of buried semiconductor material regions 14 is arranged between the first current electrode 17 and the control electrode 13. Said region of the first compound semiconductor material 11 extending between the first current electrode 17 and the control electrode 13 is also referred to as a drift region of the semiconductor device 30. Thus, the plurality of buried semiconductor material regions 14 is arranged in the drift region of the semiconductor device 30. Regions other than the drift region do not include buried semiconductor material regions 14, i.e. the buried semiconductor material regions 14 are not arranged in regions other than the drift region. In the illustrated embodiment, the plurality of buried the semiconductor material regions 14 is floating.

Figure 4:
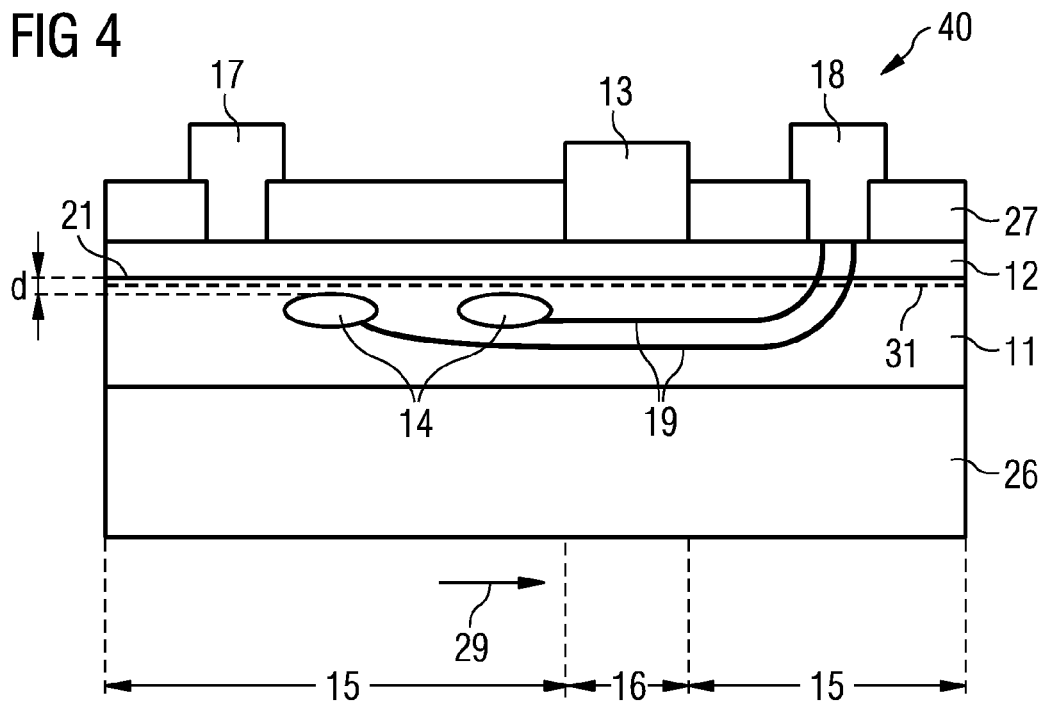
FIG. 4 illustrates a schematic view of a semiconductor device according to a fourth embodiment.

FIG. 4 illustrates a schematic view of a semiconductor device 40 according to a fourth embodiment.

The semiconductor device 40 of the fourth embodiment differs from the semiconductor device 30 of the third embodiment in that the semiconductor device 40 further includes a plurality of coupling components 19 electrically coupling the plurality of buried semiconductor material regions 14 to the second current electrode 18.

In FIG. 4, two coupling components 19 are illustrated. However, the semiconductor device 40 may include more than two coupling components 19 or may include a single coupling component 19. The coupling components 19 are illustrated schematically in FIG. 4. Typically, the coupling components 19 extend laterally in the first compound semiconductor material 11 in a direction perpendicular to the plane illustrated in FIG. 4 and are directed vertically to the second current electrode 18 at an edge region of the semiconductor device 40. The coupling components 19 include an electrically conductive material, for example a metal or highly doped polysilicon.

Figure 5:
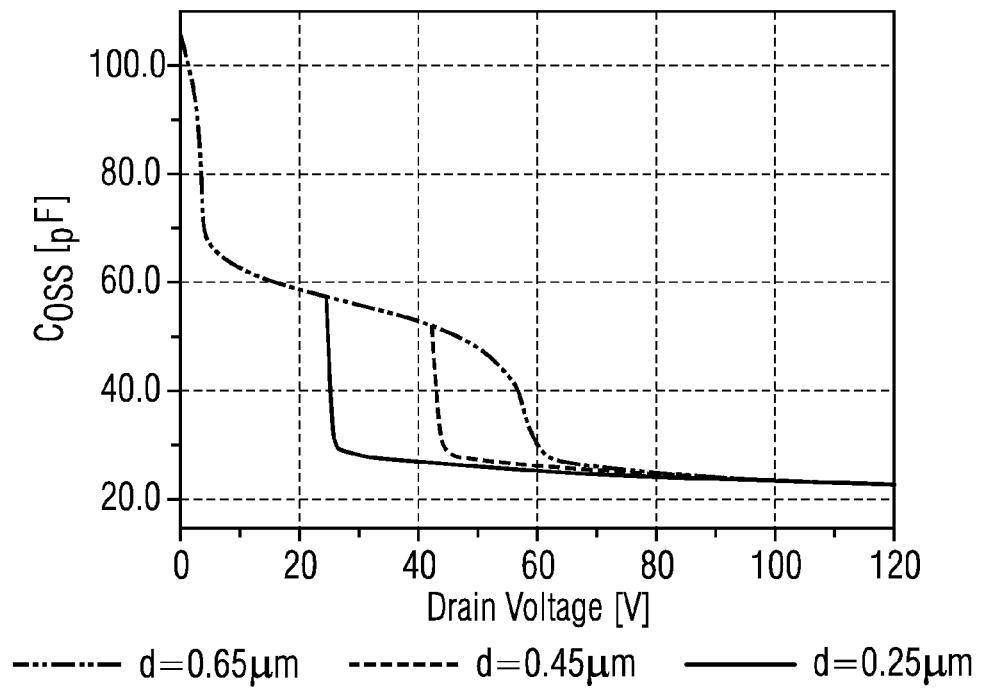
FIGS. 5 to 7 illustrate calculations performed for a semiconductor device including at least one buried semiconductor material region as illustrated in FIGS. 1 to 4.
Figure 6:
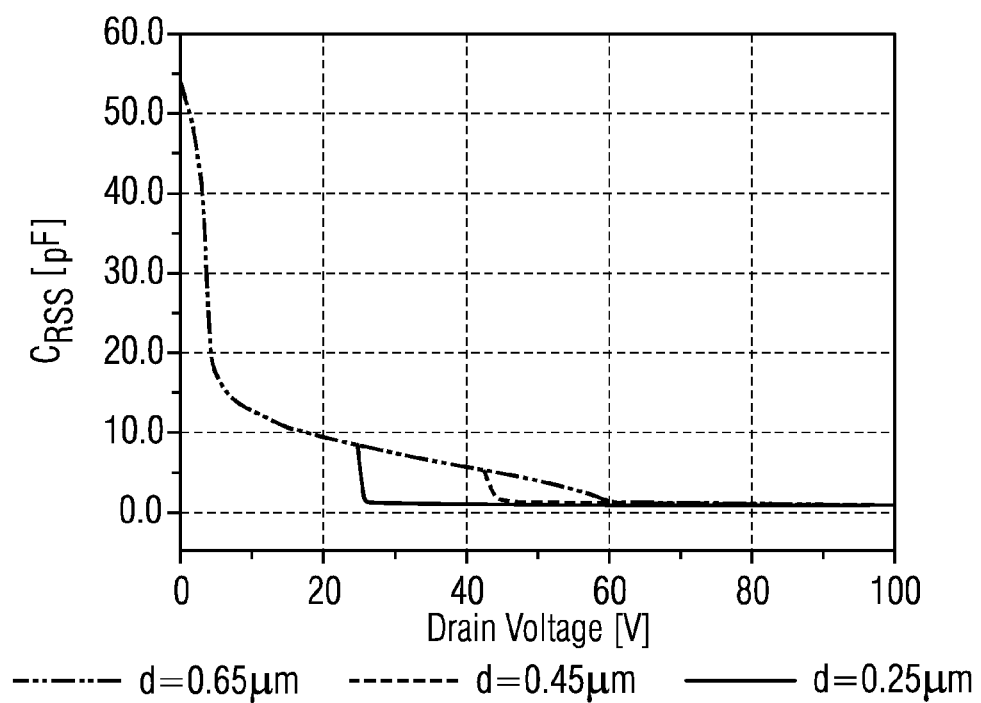
Figure 7:
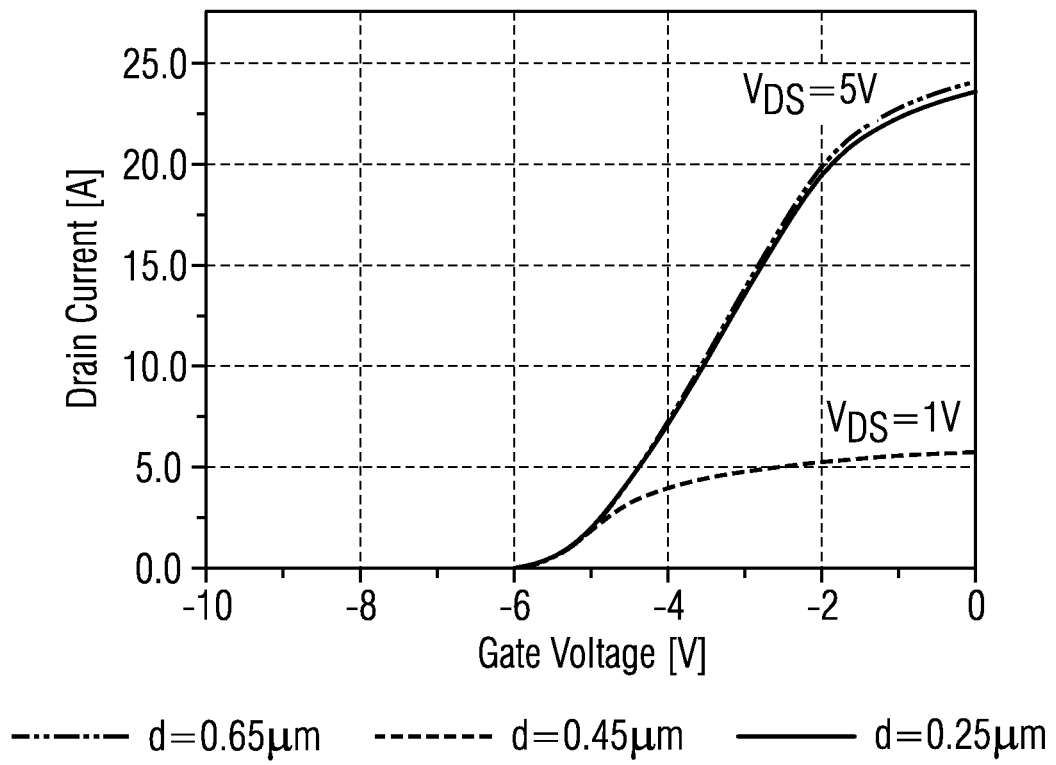

FIGS. 5 to 7 illustrate calculations performed for a semiconductor device including at least one buried semiconductor material region 14 as illustrated in FIGS. 1 to 4. The calculations are performed on a 650V normally-on GaN device including a floating p-type region disposed in the first compound semiconductor material 11 in the region 15 not covered by the control electrode 13 at a certain distance d from the heterojunction 21. The distance d is varied in a range of 0.25 µm ≤ d ≤ 0.7 µm in order to determine the influence of the buried semiconductor material region on the device capacitance and also on the overall current drive capability.

FIG. 5 illustrates graphs of the device output capacitance $C_{OSS}$ as a function of the distance d of the buried semiconductor material region from the heterojunction for three different values of the distance d, namely 0.25 µm, 0.45 µm and 0.65 µm, with drain voltage on the abscissa and device output capacitance $C_{OSS}$ on the ordinate. The three graphs for the three different values of the distance d partially overlap in FIG. 5.

FIG. 6 illustrates graphs of the device gate-to-drain capacitance $C_{RSS}$ as a function of the distance d of the buried semiconductor material region from the heterojunction for three different values of the distance d, namely 0.25 µm, 0.45 µm and 0.65 µm, with drain voltage on the abscissa and gate-to-drain capacitance $C_{RSS}$ on the ordinate. The three graphs for the three different values of the distance d partially overlap in FIG. 6.

FIG. 7 illustrates graphs of the device drain current for two different values of the drain-to-source voltage $V_{DS}$, namely 1V and 5V, as a function of the distance d of the buried semiconductor material region from the heterojunction for three different values of the distance d, namely 0.25 µm, 0.45 µm and 0.65 µm, with gate voltage on the abscissa and drain current on the ordinate. The three graphs for the three different values of the distance d partially overlap for each of the two different values of the drain-to-source voltage $V_{DS}$ in FIG. 7.

As illustrated in FIGS. 5 to 7, providing at least one buried semiconductor material region at a distance d from the heterojunction between the first compound semiconductor material and the second compound semiconductor material in a range of 0.25 µm ≤ d ≤ 0.7 µm may effectively reduce the device capacitance by changing the electrical field distribution while maintaining a high current capability. For the above mentioned semiconductor device for which the calculations were performed the reduction of the device capacitance occurs in a range of about 25 V to 60 V, depending on the distance d of the buried semiconductor material region from the heterojunction. Arranging a buried semiconductor material region at a distance less than 0.25 µm may provide an adverse effect on the charge carriers at the heterojunction, whereas arranging a buried semiconductor material region at a distance more than 0.7 μm may not sufficiently change the electrical field distribution.

Figure 8:
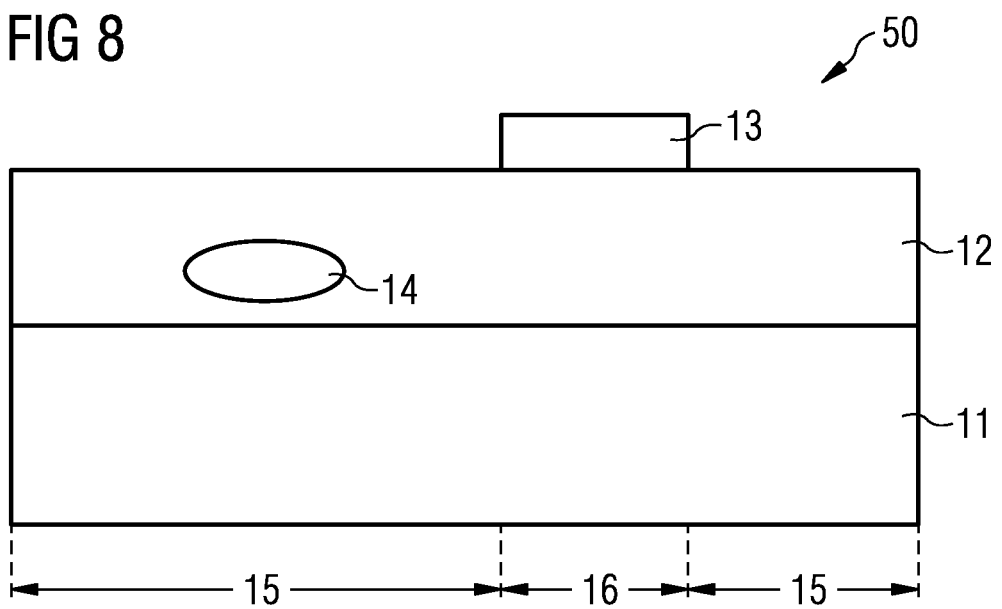
FIG. 8 illustrates a schematic view of a semiconductor device according to a fifth embodiment.

FIG. 8 illustrates a schematic view of a section of a semiconductor device 50 according to a fifth embodiment.

The semiconductor device 50 includes a first compound semiconductor material 11 and a second compound semiconductor material 12 on the first compound semiconductor material 11. The second compound semiconductor material 12 includes a first doping concentration and the second compound semiconductor material 12 includes a different material than the first compound semiconductor material 11. The semiconductor device 50 further includes a control electrode 13 and at least one buried semiconductor material region 14 including a second doping concentration different from the first doping concentration of the second compound semiconductor material 12. The at least one buried semiconductor material region 14 is disposed in the second compound semiconductor material 12 in a region 15 other than a region 16 of the second compound semiconductor material 12 being covered by the control electrode 13.

The first compound semiconductor material 11 may include a first bandgap and the second compound semiconductor material 12 may include a second bandgap, the second bandgap being different from the first bandgap. The first compound semiconductor material 11 may include GaN and the second compound semiconductor material 12 may include AlGaN. The semiconductor device 50 may be a high electron mobility transistor (HEMT).

The at least one buried semiconductor material region 14 may include a p-type dopant material. The p-type dopant material may include a doping concentration N, wherein $N>5 \cdot 10^{17}$ cm$^{-3}$ and may include at least one of B, Al, Ga, Mg, Fe, Cr, Cd and Zn.

The semiconductor device 50 may further include a first current electrode and a second current electrode, wherein in a lateral direction, the at least one buried semiconductor material region 14 is arranged between the first current electrode and the control electrode. The at least one buried semiconductor material region 14 may extend from the first current electrode to the control electrode 13 in the lateral direction.

The semiconductor device 50 may further include at least one field plate including an electrically conductive material, for example a metal or highly doped polysilicon. The at least one field plate may extend in the lateral direction from the second current electrode to the control electrode and may be electrically coupled to the second current electrode.

The at least one buried semiconductor material region 14 may be floating or may be electrically coupled to a fixed electrical potential. Moreover, the at least one buried semiconductor material region 14 may be electrically coupled to the second current electrode. The semiconductor device 50 may further include at least one coupling component electrically coupling the at least one buried semiconductor material region 14 to the second current electrode.

A method of producing the semiconductor device 50 may include: providing the first compound semiconductor material 11; providing the second compound semiconductor material 12 on the first compound semiconductor material 11, the second compound semiconductor material 12 including a first doping concentration and including a different material than the first compound semiconductor material 11; providing the control electrode 13 on the second compound semiconductor material 12; and providing the at least one buried semiconductor material region 14 including a second doping concentration different from the first doping concentration, wherein the at least one buried semiconductor material region 14 is disposed in the second compound semiconductor material 12 in the region 15 other than the region 16 of the second compound semiconductor material 12 being covered by the control electrode 13.

The at least one buried semiconductor material region 14 may be provided by the following steps: applying a structured mask on the second compound semiconductor material 12, the structured mask including at least one opening, implanting dopants through the at least one opening of the structured mask into the second compound semiconductor material 12 and removing the structured mask.

FIG. 9 illustrates a schematic view of a semiconductor device 60 according to a sixth embodiment.

The semiconductor device 60 includes a first compound semiconductor material 11 and a second compound semiconductor material 12 on the first compound semiconductor material 11. The second compound semiconductor material 12 includes a different material than the first compound semiconductor material 11. The semiconductor device 60 further includes a substrate 26. The substrate 26 may include Si, SiC or Al$_2$O$_3$. The first compound semiconductor material 11 is arranged on the substrate 26.

In the illustrated embodiment, the first compound semiconductor material 11 includes GaN and the second compound semiconductor material 12 includes AlGaN, i.e. an alloy described by the formula Al$_x$Ga$_{(1-x)}$N, where x<1. The first compound semiconductor material 11 thus includes a first bandgap and the second compound semiconductor material 12 includes a second bandgap, the second bandgap being different from the first bandgap so that a heterojunction 21 is formed at the interface between the respective compound semiconductor materials. A two-dimensional electron gas is formed at the heterojunction 21 formed between the first compound semiconductor material 11 and the second compound semiconductor material 12 and is indicated by a dotted line 31 in FIG. 9. The semiconductor device 60 is thus provided in the form of a gallium nitride-based HEMT (high electron mobility transistor), the first compound semiconductor material 11 providing a channel layer and the second compound semiconductor material 12 providing a barrier layer of the HEMT.

In the illustrated embodiment, both the first compound semiconductor material 11 and the second compound semiconductor material 12 are unintentionally doped. The first compound semiconductor material 11 includes a third doping concentration of unintentional doping and the second compound semiconductor material 12 includes a first doping concentration of unintentional doping.

The semiconductor device 60 further includes a control electrode 13 arranged on the second compound semiconductor material 12 and providing a gate electrode of the gallium nitride-based HEMT. The control electrode 13 is configured to control the semiconductor device 60 by applying a suitable voltage to the control electrode 13. Moreover, the semiconductor device 60 includes a first current electrode 17 and a second current electrode 18. The first current electrode 17 provides a drain electrode of the gallium nitride-based HEMT and the second current electrode 18 provides a source electrode of the gallium nitride-based HEMT. The first current electrode 17, the second current electrode 18 and the control electrode 13 include an electrically conductive material, for example a metal or highly doped polysilicon.

The semiconductor device 60 further includes a passivation layer 27 arranged on the second compound semiconductor material 12. The passivation layer 27 may include a material selected from the group consisting of $Si_xN_y$, $SiO_2$ and $Al_2O_3$. The control electrode 13, the first current electrode 17 and the second current electrode 18 extend through the passivation layer 27 and directly contact the second compound semiconductor material 12. A region 16 of the second compound semiconductor material 12 is covered by the control electrode 13. A further region 15 of the second compound semiconductor material 12 other than the region 16 is not covered by the control electrode 13.

The semiconductor device 60 further includes a plurality of buried semiconductor material regions 14 including a second doping concentration different from the first doping concentration of the second compound semiconductor material 12. The plurality of buried semiconductor material regions 14 includes a p-type dopant material. The p-type dopant material includes a doping concentration N, wherein $N > 5 \cdot 10^{17}$ cm$^{-3}$, and may include at least one of Mg, C, Zn and Cd.

In FIG. 9, two buried semiconductor material regions 14 are illustrated. However, the semiconductor device 60 may include more than two buried semiconductor material regions 14 or may include a single buried semiconductor material region 14. The plurality of buried semiconductor material regions 14 is disposed in the second compound semiconductor material 12 in the region 15 not covered by the control electrode 13. In a lateral direction which is schematically illustrated in FIG. 9 by an arrow 29, the plurality of buried semiconductor material regions 14 is arranged between the first current electrode 17 and the control electrode 13. Said region of the second compound semiconductor material 12 extending between the first current electrode 17 and the control electrode 13 is also referred to as a drift region of the semiconductor device 60. Thus, the plurality of buried semiconductor material regions 14 is arranged in the drift region of the semiconductor device 60. Regions other than the drift region do not include buried semiconductor material regions 14, i.e. the buried semiconductor material regions 14 are not arranged in regions other than the drift region. In the illustrated embodiment, the plurality of buried the semiconductor material regions 14 is floating.

FIG. 10 illustrates a schematic view of a semiconductor device 70 according to a seventh embodiment.

The semiconductor device 70 of the seventh embodiment differs from the semiconductor device 60 of the sixth embodiment in that the semiconductor device 70 further includes a plurality of coupling components 19 electrically coupling the plurality of buried semiconductor material regions 14 to the second current electrode 18.

In FIG. 10, two coupling components 19 are illustrated. However, the semiconductor device 70 may include more than two coupling components 19 or may include a single coupling component 19. The coupling components 19 are illustrated schematically in FIG. 10. Typically, the coupling components 19 extend laterally in the second compound semiconductor material 12 in a direction perpendicular to the plane illustrated in FIG. 10 and are directed vertically to the second current electrode 18 at an edge region of the semiconductor device 70. The coupling components 19 include an electrically conductive material, for example a metal or highly doped polysilicon.

Providing the at least one buried semiconductor material region 14 in the second compound semiconductor material 12 for the semiconductor devices illustrated in FIGS. 8 to 10 may effectively reduce the device capacitance by changing the electrical field distribution while maintaining a high current capability.

FIGS. 11A to 11F illustrate a method of producing a semiconductor device 80 according to a first embodiment. In the illustrated embodiment, the semiconductor device 80 is provided in the form of a gallium nitride-based HEMT.

Figure 11A:
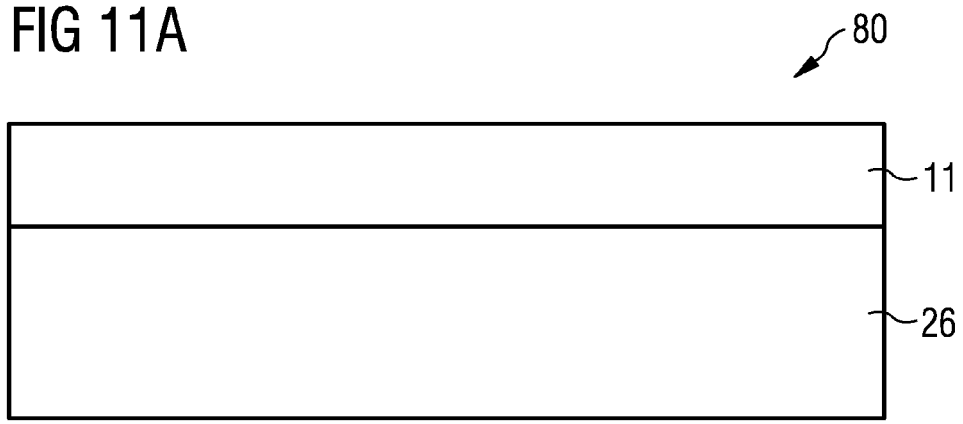
FIGS. 11A to 11F illustrate a method of producing a semiconductor device according to a first embodiment.

A substrate 26 is provided. The substrate 26 may include Si, SiC or $Al_2O_3$. A first compound semiconductor material 11 is provided on the substrate 26. In the illustrated embodiment, the first compound semiconductor material 11 includes unintentionally doped GaN. FIG. 11A illustrates the semiconductor device 80 after the above-mentioned process steps.

Figure 11B:
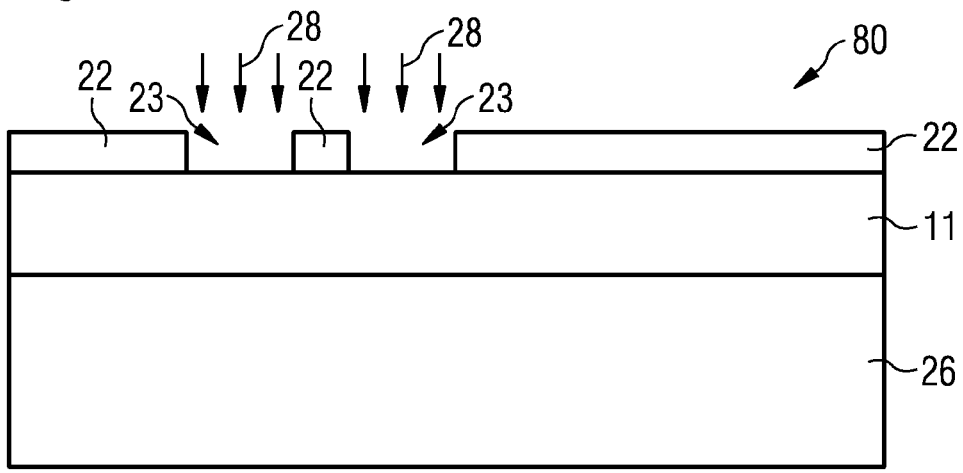

In a further process step, a structured mask 22 is provided on the first compound semiconductor material 11 by applying a structured photolithographic layer on the first compound semiconductor material 11. The structured mask 22 includes a plurality of openings 23. In FIG. 11B, two openings 23 are illustrated. However, the structured mask 22 may include more than two openings 23 or may include a single opening 23.

A p-type dopant material is implanted through the openings 23 of the structured mask 22 into the first compound semiconductor material 11 by performing an ion implantation schematically illustrated in FIG. 11B by arrows 28. The ion implantation may be performed in one process step or several implantation steps may be performed. The p-type dopant material may include at least one of Mg, C, Zn and Cd.

Figure 11C:
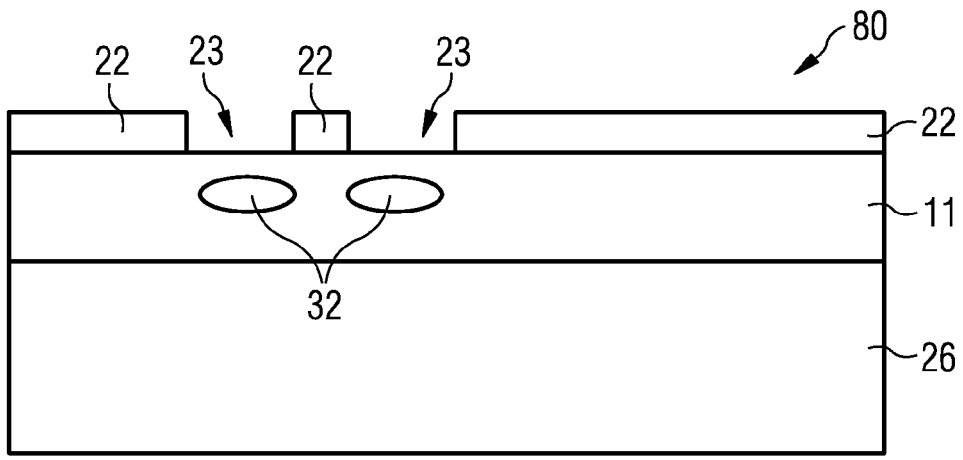

Islands 32 of dopant material are thereby formed below the openings 23 of the structured mask 22 as schematically illustrated in FIG. 11C.

Figure 11D:
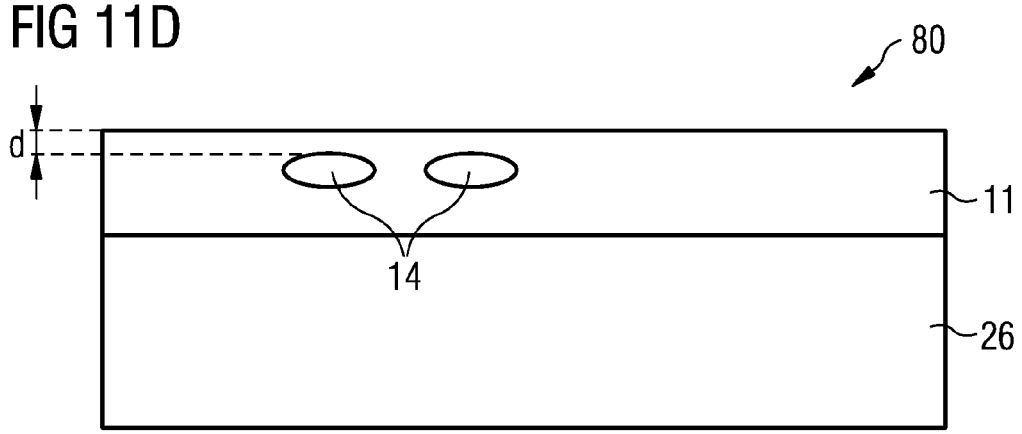

In a further process step, the structured mask 22 is removed. A thermal annealing step is performed, activating the dopant material of the islands 32, thereby providing a plurality of buried p-type semiconductor material regions 14. The thermal annealing step may be performed directly after removing the structured mask 22 or at a later stage during the device fabrication process. An implantation energy of the ion implantation and a temperature and duration of the annealing step are provided such that the plurality of buried p-type semiconductor material regions 14 is arranged at a distance d from the heterojunction 21 in a range of $0.25$ μm $\leq d \leq 0.7$ μm. A doping concentration N of the p-type semiconductor material regions 14 may be above $5 \cdot 10^{17}$ cm$^{-3}$. FIG. 11D illustrates the semiconductor device 80 after the above-mentioned process steps. In FIG. 11D, two buried semiconductor material regions 14 are illustrated. However, the semiconductor device 80 may include more than two buried semiconductor material regions 14 or may include a single buried semiconductor material region 14.

Figure 11E:
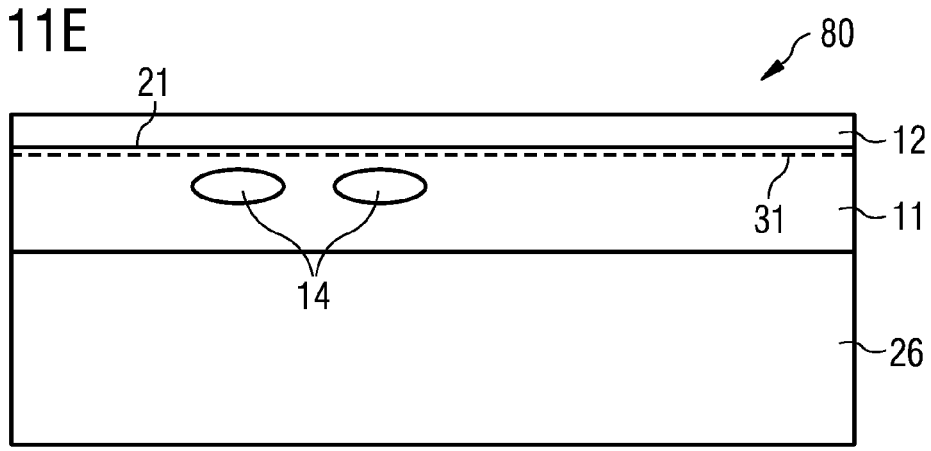

A second compound semiconductor material 12 is provided on the first compound semiconductor material 11. In the illustrated embodiment, the second compound semiconductor material 12 includes unintentionally doped AlGaN. FIG. 11E illustrates the semiconductor device 80 after the above-mentioned process step.

Figure 11F:
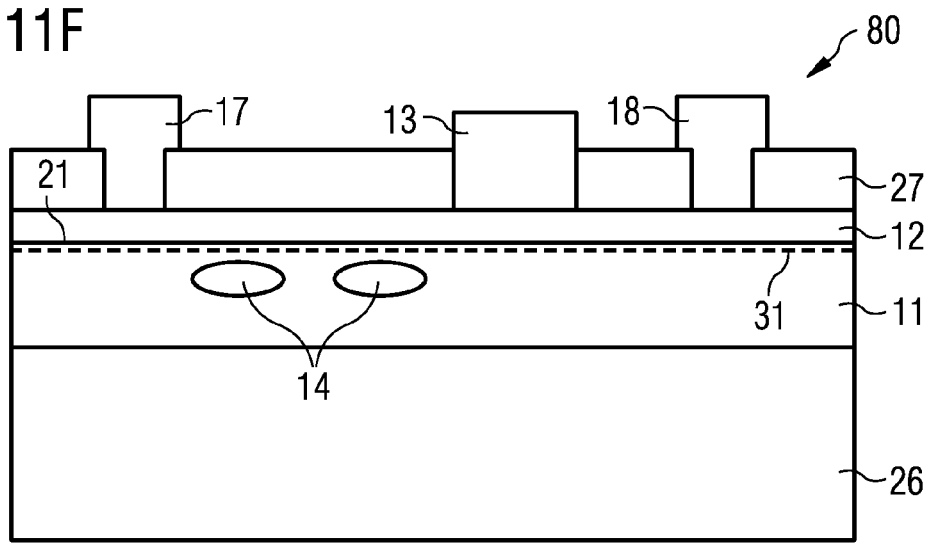

In a further process step, a passivation layer 27 is provided on the second compound semiconductor material 12. The passivation layer 27 may include a material selected from the group consisting of $Si_xN_y$, $SiO_2$ and $Al_2O_3$. Further, a first current electrode 17, a second current electrode 18 and a control electrode 13 including an electrically conductive material, for example a metal or highly doped polysilicon, are provided such that the plurality of buried semiconductor material regions 14 is arranged between the first current electrode 17 and the control electrode 13. The first current electrode 17, the second current electrode 18 and the control electrode 13 extend through the passivation layer 27 and directly contact the second compound semiconductor material 12. FIG. 11F illustrates the semiconductor device 80 after the above-mentioned process steps.

FIGS. 12A to 12F illustrate a method of producing a semiconductor device 90 according to a second embodiment.

Figure 12A:
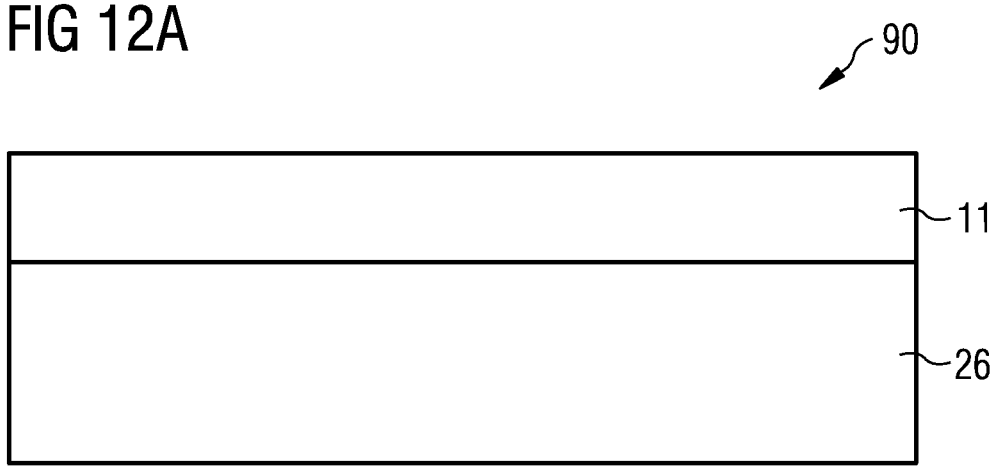

A substrate 26 is provided. The substrate 26 may include Si, SiC or $Al_2O_3$. A first compound semiconductor material 11 is provided on the substrate 26. In the illustrated embodiment, the first compound semiconductor material 11 includes unintentionally doped GaN. FIG. 12A illustrates the semiconductor device 90 after the above-mentioned process steps.

Figure 12B:
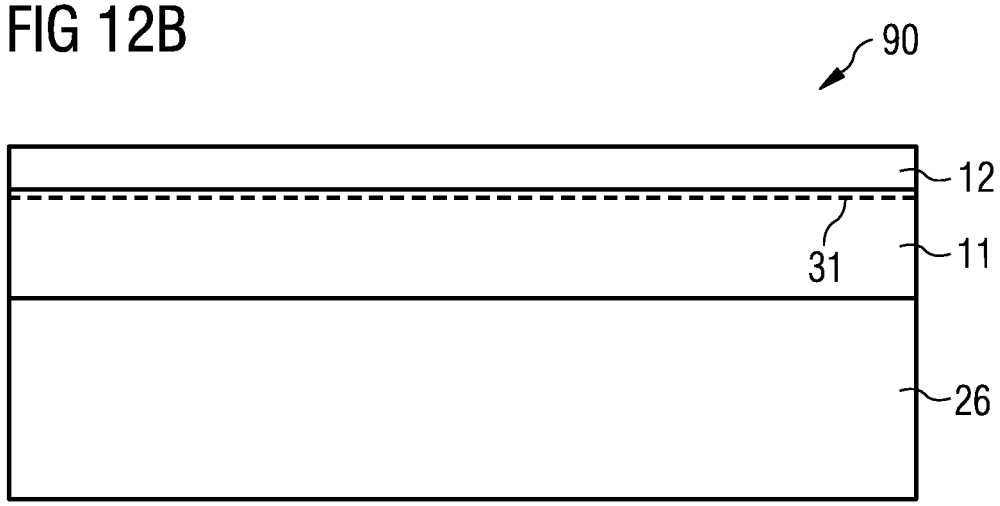

A second compound semiconductor material 12 is provided on the first compound semiconductor material 11. In the illustrated embodiment, the second compound semiconductor material 12 includes unintentionally doped AlGaN. FIG. 12B illustrates the semiconductor device 90 after the above-mentioned process step.

In a further process step, a structured mask 24 is provided on the second compound semiconductor material 12 by applying a structured photolithographic layer on the second compound semiconductor material 12. The structured mask 24 includes a plurality of openings 25. In FIG. 12C, two openings 25 are illustrated. However, the structured mask 24 may include more than two openings 25 or may include a single opening 25.

A p-type dopant material is implanted through the openings 25 of the structured mask 24 into the first compound semiconductor material 11 by performing an ion implantation schematically illustrated in FIG. 12C by arrows 28. The ion implantation may be performed in one process step or several implantation steps may be performed. The p-type dopant material may include at least one of Mg, C, Zn and Cd.

Islands 32 of dopant material are thereby formed in the first compound semiconductor material 11 below the openings 25 of the structured mask 24 as schematically illustrated in FIG. 12D.

Figure 12E:
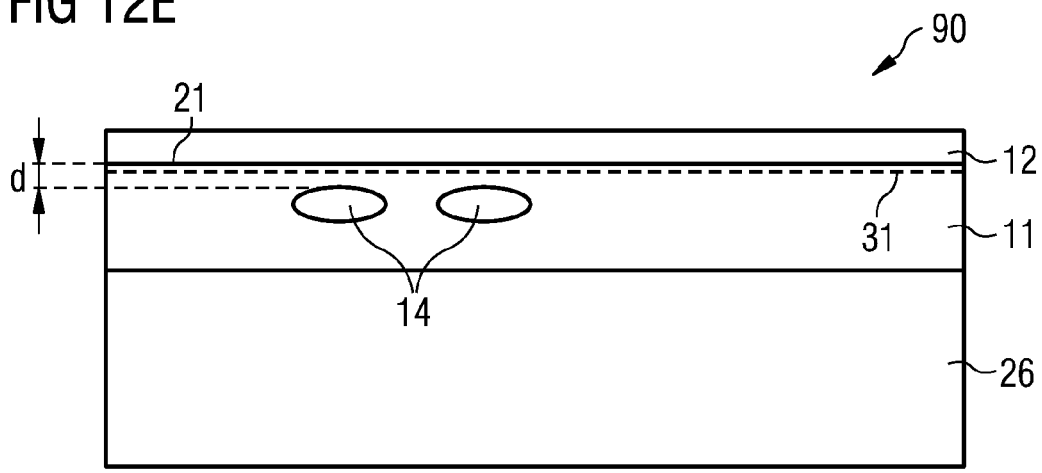

In a further process step, the structured mask 24 is removed. A thermal annealing step is performed, activating the dopant material of the islands 32, thereby providing a plurality of buried p-type semiconductor material regions 14 in the first compound semiconductor material 11. The thermal annealing may be performed at a later stage in the device manufacturing process rather than after the removal of the structured mask 24. An implantation energy of the ion implantation and a temperature and duration of the annealing step are provided such that the plurality of buried p-type semiconductor material regions 14 is arranged at a distance d from the heterojunction 21 in a range of $0.25\ \mu m \leq d \leq 0.7\ \mu m$. A doping concentration N of the p-type semiconductor material regions 14 may be above $5 \cdot 10^{17}\ cm^{-3}$. FIG. 12E illustrates the semiconductor device 90 after the above-mentioned process steps. In FIG. 12E, two buried semiconductor material regions 14 are illustrated. However, the semiconductor device 90 may include more than two buried semiconductor material regions 14 or may include a single buried semiconductor material region 14.

Figure 12F:
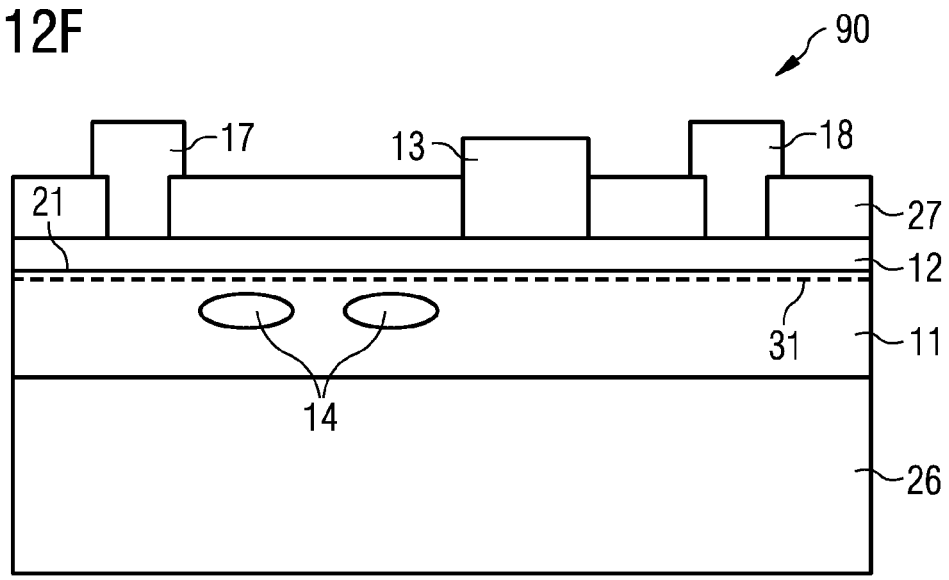

In a further process step, a passivation layer 27 is provided on the second compound semiconductor material 12. The passivation layer 27 may include a material selected from the group consisting of $Si_xN_y$, $SiO_2$ and $Al_2O_3$. Further, a first current electrode 17, a second current electrode 18 and a control electrode 13 including an electrically conductive material, for example a metal or highly doped polysilicon, are provided such that the plurality of buried semiconductor material regions 14 is arranged between the first current electrode 17 and the control electrode 13. The first current electrode 17, the second current electrode 18 and the control electrode 13 extend through the passivation layer 27 and directly contact the second compound semiconductor material 12. FIG. 12F illustrates the semiconductor device 90 after the above-mentioned process steps.

FIGS. 13A to 13F illustrate a method of producing a semiconductor device 100 according to a third embodiment.

Figure 13A:
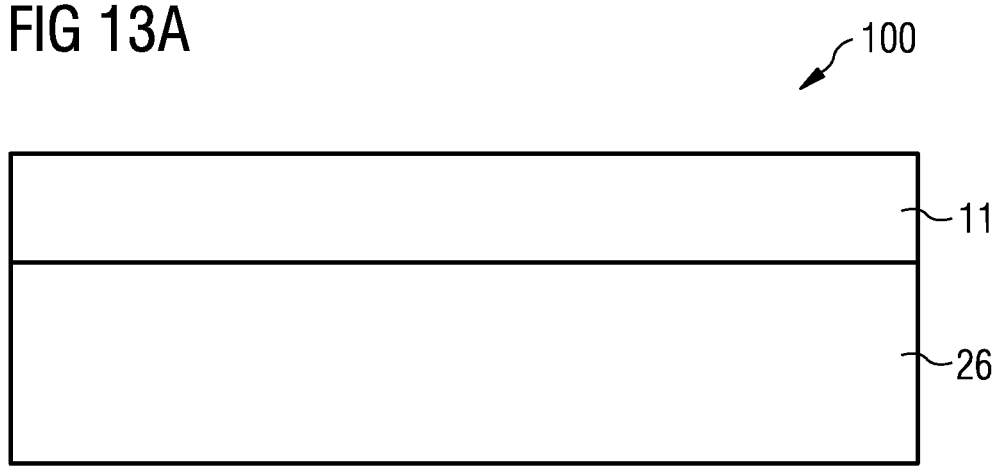

A substrate 26 is provided. The substrate 26 may include Si, SiC or $Al_2O_3$. A first compound semiconductor material 11 is provided on the substrate 26. In the illustrated embodiment, the first compound semiconductor material 11 includes unintentionally doped GaN. FIG. 13A illustrates the semiconductor device 100 after the above-mentioned process steps.

Figure 13B:
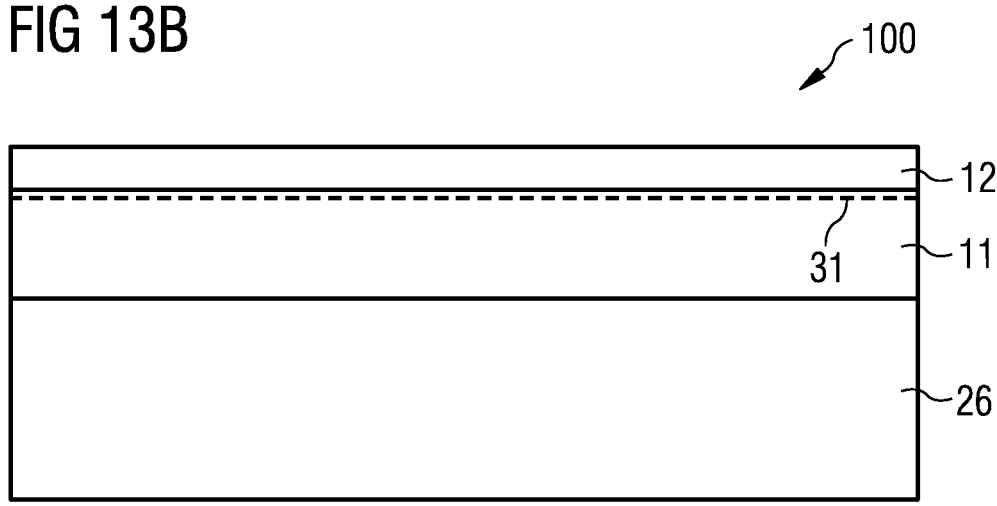

A second compound semiconductor material 12 is provided on the first compound semiconductor material 11. In the illustrated embodiment, the second compound semiconductor material 12 includes unintentionally doped AlGaN. FIG. 13B illustrates the semiconductor device 100 after the above-mentioned process step.

In a further process step, a structured mask 24 is provided on the second compound semiconductor material 12 by applying a structured photolithographic layer on the second compound semiconductor material 12. The structured mask 24 includes a plurality of openings 25. In FIG. 13C, two openings 25 are illustrated. However, the structured mask 24 may include more than two openings 25 or may include a single opening 25.

A p-type dopant material is implanted through the openings 25 of the structured mask 24 into the second compound semiconductor material 12 by performing an ion implantation schematically illustrated in FIG. 13C by arrows 28. The ion implantation may be performed in one process step or several implantation steps may be performed. The p-type dopant material may include at least one of Mg, C, Zn and Cd.

Islands 32 of dopant material are thereby formed in the second compound semiconductor material 12 below the openings 25 of the structured mask 24 as schematically illustrated in FIG. 13D.

In a further process step, the structured mask 24 is removed. A thermal annealing step is performed, either directly after the removal of the structured make 24 or at a later stage in the process to manufacture the device in order to activate the dopant material of the islands 32, thereby providing a plurality of buried p-type semiconductor material regions 14 in the second compound semiconductor material 12. An implantation energy of the ion implantation and a temperature and duration of the annealing step are provided such that the plurality of buried p-type semiconductor material regions 14 is arranged in the second compound semiconductor material 12. A doping concentration N of the p-type semiconductor material regions 14 may be above $5 \cdot 10^{17}\ cm^{-3}$. FIG. 13E illustrates the semiconductor device 100 after the above-mentioned process steps. In FIG. 13E, two buried semiconductor material regions 14 are illustrated. However, the semiconductor device 100 may include more than two buried semiconductor material regions 14 or may include a single buried semiconductor material region 14.

In a further process step, a passivation layer 27 is provided on the second compound semiconductor material 12. The passivation layer 27 may include a material selected from the group consisting of $Si_xN_y$, $SiO_2$ and $Al_2O_3$. Further, a first current electrode 17, a second current electrode 18 and a control electrode 13 including an electrically conductive material, for example a metal or highly doped polysilicon, are provided such that the plurality of buried semiconductor material regions 14 is arranged between the first current electrode 17 and the control electrode 13. The first current electrode 17, the second current electrode 18 and the control electrode 13 extend through the passivation layer 27 and directly contact the second compound semiconductor material 12. FIG. 13F illustrates the semiconductor device 100 after the above-mentioned process steps.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first compound semiconductor material;
a second compound semiconductor material on the first compound semiconductor material, the second compound semiconductor material comprising a different material than the first compound semiconductor material;
a control electrode; and
at least one buried semiconductor material region disposed in the second compound semiconductor material in a region other than a region of the second compound semiconductor material being covered by the control electrode, the at least one buried semiconductor material region comprising a p-type dopant material.

2. The semiconductor device of claim 1, further comprising a first current electrode and a second current electrode, and wherein in a lateral direction, the at least one buried semiconductor material region is arranged between the first current electrode and the control electrode.

3. The semiconductor device of claim 2, wherein the at least one buried semiconductor material region extends from the first current electrode to the control electrode in the lateral direction.

4. The semiconductor device of claim 2, wherein the at least one buried semiconductor material region is electrically coupled to the second current electrode.

5. The semiconductor device of claim 4, further comprising at least one coupling component electrically coupling the at least one buried semiconductor material region to the second current electrode.

6. The semiconductor device of claim 1, wherein the p-type dopant material has a doping concentration N, and wherein $N > 5 \cdot 10^{17}$ $cm^{-3}$.

7. The semiconductor device of claim 1, wherein the p-type dopant material comprises at least one of B, Al, Ga, Mg, Fe, Cr, Cd and Zn.

8. The semiconductor device of claim 1, wherein the at least one buried semiconductor material region is floating.

9. The semiconductor device of claim 1, wherein the at least one buried semiconductor material region is electrically coupled to a fixed electrical potential.

10. The semiconductor device of claim 1, wherein the first compound semiconductor material has a first bandgap and the second compound semiconductor material has a second bandgap, and wherein the second bandgap is different from the first bandgap.

11. The semiconductor device of claim 1, wherein the first compound semiconductor material comprises GaN.

12. The semiconductor device of claim 1, wherein the second compound semiconductor material comprises AlGaN.

13. The semiconductor device of claim 1, wherein the semiconductor device is a gallium nitride-based HEMT (high electron mobility transistor), and wherein the first compound semiconductor material provides a channel layer and the second compound semiconductor material provides a barrier layer of the gallium nitride-based HEMT.

14. A method of producing a semiconductor device, the method comprising:
providing a first compound semiconductor material;
providing a second compound semiconductor material on the first compound semiconductor material, the second compound semiconductor material comprising a different material than the first compound semiconductor material;
providing a control electrode on the second compound semiconductor material; and
providing at least one buried semiconductor material region disposed in the second compound semiconductor material in a region other than a region of the second compound semiconductor material being covered by the control electrode, the at least one buried semiconductor material region comprising a p-type dopant material.

15. The method of claim 14, wherein providing the at least one buried semiconductor material region comprises:
forming a structured mask on the second compound semiconductor material, the structured mask comprising at least one opening; and
implanting p-type dopants through the at least one opening of the structured mask into the second compound semiconductor material and removing the structured mask.

16. A semiconductor device, comprising:
a first compound semiconductor material;
a second compound semiconductor material on the first compound semiconductor material, the second compound semiconductor material comprising a different material than the first compound semiconductor material;
a control electrode; and
at least one buried semiconductor material region disposed in the second compound semiconductor material in a region other than a region of the second compound semiconductor material being covered by the control electrode, the at least one buried semiconductor material region being separated from the first compound semiconductor material by part of the second compound semiconductor material.

* * * * *